United States Patent [19]

Fitzgerald et al.

[11] Patent Number: 5,556,924
[45] Date of Patent: Sep. 17, 1996

[54] SYNTHESIS OF PHOTOREACTIVE POLYMERIC BINDERS

[75] Inventors: Maurice J. Fitzgerald, Canton; Frederick R. Kearney, Walpole; Rong-Chang Liang, Newton; William C. Schwarzel, Billerica, all of Mass.

[73] Assignee: Polaroid Corporation, Cambridge, Mass.

[21] Appl. No.: 602,046

[22] Filed: Feb. 15, 1996

Related U.S. Application Data

[60] Division of Ser. No. 429,804, Apr. 27, 1995, Pat. No. 5,514,522, which is a continuation-in-part of Ser. No. 146,711, Nov. 1, 1993, abandoned.

[51] Int. Cl.$^6$ .......................... C08F 283/00; G03F 7/035
[52] U.S. Cl. .......................... 525/293; 525/303; 525/285; 525/308; 430/284.1
[58] Field of Search .................. 525/303, 293, 525/285, 308

[56] References Cited

U.S. PATENT DOCUMENTS

| | | | |
|---|---|---|---|
| 3,418,295 | 12/1968 | Schoenthaler | 260/80.72 |
| 3,448,089 | 6/1969 | Celeste | 260/78.5 |
| 4,162,274 | 7/1979 | Rosenkranz | 528/75 |
| 4,273,857 | 6/1981 | Leberzammer et al. | 430/281 |
| 4,343,919 | 8/1982 | Tefertiller et al. | 525/278 |
| 4,408,532 | 11/1983 | Incremona | 101/456 |
| 4,833,207 | 5/1989 | Kinaga et al. | 525/276 |
| 4,990,428 | 2/1991 | Shimizu et al. | 430/276 |
| 5,234,794 | 8/1993 | Sebald et al. | 430/325 |
| 5,274,045 | 12/1993 | Yukawa et al. | 525/293 |
| 5,341,799 | 8/1994 | Fifield | 528/49 |
| 5,362,605 | 11/1994 | Mirle | 430/284 |
| 5,364,741 | 11/1994 | Huynh-Tran | 430/300 |
| 5,416,127 | 5/1995 | Chandran et al. | 522/149 |

FOREIGN PATENT DOCUMENTS

0345748A2  12/1989  European Pat. Off. .

OTHER PUBLICATIONS

Fitzgerald, Maurice, et al., "Photoreactive Binders for Photo-Resists Based on Acrylate Subsituted m-TMI Copolymers," IS&T's 47$^{th}$ Annual Conference/ICPS 1994, pp. 797–799.

Record of JP 4001 214 A (Sanyo Chem Ind Ltd), download from Database WPI (Section Ch, Week 9207, Derwent Publications, Ltd.) (Jan. 1992).

R. W. Dexter, R. Saxon, and D. E. Fiori, "m-TMI, a Novel Unsaturated Aliphatic Isocyanate," T. Coating Technology, 58 (737), 43 (Jun. 1986).

G. Odian, "Principles of Polymerization, 2nd ed.", John Wiley and Sons (1981), pp. 460–463.

B. C. Trividi and B. M. Culbertson, "Maleic Anhydride", Plenum Press (1982), pp. 291, 412.

*Primary Examiner*—Vasu S. Jagannathan
*Attorney, Agent, or Firm*—Renato M. de Luna

[57] ABSTRACT

A photoreactive binder that may be used to enhance photospeed in either conventional plates or on-press developable lithographic printing plates. Briefly, a polymer of m-isopropenyl-$\alpha,\alpha$-dimethylbenzyl isocyanate is derivatized for vinyl group reactivity by reacting the isocyanate groups thereof with hydroxyalkyl acrylate. The resulting photopolymeric binder provides significantly higher photospeed than the non-reactive binder currently utilized in the production of conventional printing plates. The resulting lithographic printing plate also shows better durability (as manifested by longer run-length) and is more easily developed by the microencapsulated developers utilized in the present invention. As to the preparation of the photoreactive binders, the application discloses a method of copolymerizing m-isopropenyl-$\alpha,\alpha$-dimethylbenzyl isocyanate (m-TMI) through complexation with an electron-deficient monomer such as maleic anhydride to accelerate free radical copolymerization with other monomers, and thus, provides greater monomer-to-polymer conversion. Use of the resulting product in the photoresist of a lithographic printing plate improves its adhesion to an underlying substrate.

6 Claims, No Drawings

SYNTHESIS OF PHOTOREACTIVE POLYMERIC BINDERS

This application is a division of application Ser. No. 08/429,804, filed Apr. 27, 1995, now U.S. Pat. No. 5,514,522, which is a continuation-in-part of application Ser. No. 08/146,711, filed Nov. 1, 1993, abandoned.

FIELD OF THE INVENTION

In general, the several composition and method manifestations of the present invention relate to photoreactive polymeric binders, and more particularly, to photoreactive polymeric binders capable of being readily and functionally incorporated into planographic photoresists to improve durability while concurrently maintaining and/or enhancing photosensitivity.

CROSS-REFERENCE TO RELATED APPLICATIONS

U.S. patent application Ser No. 08/146,710, filed on Nov. 1, 1993 now U.S. Pat. No. 5,516,620 by L. C. Wan, A. C. Giudice, J. M. Hardin, C. M. Cheng, and R. C. Liang, commonly assigned, and titled "On-Press Developable Lithographic Printing Plates", describes a lithographic printing plate for use on a printing press, with minimal or no additional processing after exposure to actinic radiation. The plate comprises a printing plate substrate, a polymeric resist layer capable of imagewise photodegradation or photohardening, and a plurality of microencapsulated developers capable of blanket-wise promoting the washing out of either exposed or unexposed areas of the polymeric resist. The microencapsulated developers may be integrated into the polymeric resist layer, or may form a separate layer deposited atop the polymeric resist layer, or may be coated onto a separate substrate capable of being brought into face-to-face contact with the resist layer.

U.S. patent application Ser. No. 08/147,044, filed Nov. 1, 1993 now abandoned by F. R. Kearney, J. M. Hardin, M. J. Fitzgerald, and R. C. Liang, commonly assigned, and titled "Lithographic Printing Plates with Plasticized Photoresists", discloses the use of plasticizers, surfactants and lithium salts as development aids for negative-working, on-press developable lithographic printing plates. Briefly, plasticizers, which are dispersible or soluble in press fountain solutions and soluble in acrylic monomers and oligomers, are incorporated into a photoresist. Such plasticizers make the photoresist more permeable to fountain solution prior to crosslinking, while being easily extracted with ink and fountain solution after crosslinking. The surfactants facilitate the dispersion of hydrophobic imaging compositions in the fountain solution and reduce scumming. Further, lithium salts may also be incorporated into the photoresist to disrupt hydrogen bonding of, for example, urethane acrylate polymers which tend to associate by hydrogen bonding, thus enhancing developability.

U.S. patent Ser. No. 08/146,479, filed Nov. 1, 1993 now abandoned by L. C. Wan, A. C. Giudice, W. C. Schwarzel, C. M. Cheng, and R. C. Liang, commonly assigned, and titled "Lithographic Printing Plates and Dispersed Rubber Additives", describes the use of rubbers and surfactants to enhance the durability of on-press developable printing plates. The rubbers are preferably incorporated into a photoresist as discrete rubber particles. To ensure a uniform and stable dispersion, the rubber components are suspended in the photoresist preferably by means of surfactants having HLBs approximately between 7.0 and 18.0.

The disclosures of the aforementioned copending applications are hereby incorporated by reference.

BACKGROUND OF THE INVENTION AND DESCRIPTION OF THE PRIOR ART

At the present time, virtually all printed copy is produced through the use of three basic types of printing plates. One type is a relief plate which prints from a raised surface. Another type is an intaglio plate which prints from a depressed surface. The third type is the lithographic plate which prints from a substantially flat surface which is neither appreciably raised above nor appreciably depressed below the adjacent and surrounding non-printing areas. Printing is occasioned by an ink's respective affinity and/or aversion to areas of different chemical properties. Lithographic printing plates are commonly processed to have water-repellent (hydrophobic), oil-receptive (oleophilic) image areas and water-receptive (hydrophilic) non-image areas.

Prior to processing for use, conventional lithographic plates will typically have a hydrophobic, photoreactive polymeric layer (i.e. photoresist) coated or otherwise deposited atop a hydrophilic substrate.

In preparing a conventional lithographic plate for use on a printing press, the plate is first exposed to actinic radiation. Specific chemical reactions are caused to occur in the plate's photoresist by exposure to actinic radiation. Such photoinduced chemical reactions may either reduce or enhance the solubility of the photoresist, depending on whether the resist is negative-working or positive-working. In negative-working plates, exposure to actinic radiation will generally cause a "hardening" of the photoresist. In positive-working plates, exposure to actinic radiation will generally cause a "softening" or "solubilization" of the photoresist.

After photoexposure, a wet development step is normally conducted. The objective of such wet development is to provide preferential solvation of the areas of the photoresist which have undergone photoinduced chemical change. Solvation under conventional development techniques will typically involve treating the exposed plate with organic solvents in a developing bath. For negative-working resists, the solvent will swell and dissolve the unexposed portions of the resist. The solvent should not swell the exposed portions or distortion of the developed image may result. For positive-working resists, the response of the unexposed and exposed coatings are reversed, but the same general principles apply.

As a result of the preferential solvation and washing away of portions of the photoresist, corresponding portions of the underlying hydrophilic substrate are uncovered. For negative-working plates, the aforementioned hydrophobic image areas correspond to the portions of the photoresist remaining after solvation and washing. The aforementioned hydrophilic non-image areas correspond to uncovered portions of the substrate. The image and non-image areas thus differentiated, the processed plate may then be mounted onto a printing press and run.

Encumbered by required wet development, the processing of conventional lithographic plates prior to their use on a printing press is time and labor consuming and involves the use of substantial quantities of organic chemicals. It will be appreciated that there is considerable attractiveness for innovations that would satisfactorily eliminate or reduce conventional lithography's long-felt dependency upon the conduct of wet development and thereby permit the use of lithographic plates on a printing press immediately after exposure without required intermediary processing.

In the past, dry-developable lithographic printing plates have been suggested which enable the wet processing steps of lithographic printing plates after exposure to be omitted and printing to be conducted by directly mounting the exposed plates on a printing press. Among printing plates that may be characterized as "on-press" developable (or related thereto) are: e.g., U.S. Pat. No. 4,273,851, issued to Muzyczko et al. on Jun. 16, 1981; U.S. Pat. No. 4,879,201, issued to Hasegawa on Nov. 7, 1989; U.S. Pat. No. 4,916, 041, issued to Hasegawa et al. on Apr. 10, 1990; U.S. Pat. No. 4,999,273, issued to Hasegawa on Mar. 12, 1991; and U.S. Pat. No. 5,258,263, issued to Z. K. Cheema, A. C. Giudice, E. L Langlais, and C. F. St. Jacques on Nov. 2, 1993.

Despite the methodologies and approaches embodied in the aforementioned patents, there is a continuing need for a lithographic printing plate that can be readily developed on a printing press and that produces a plate having durable image areas needed for good run length. Difficulty in the realization simultaneously of both "on press developability" and "durability" is believed to originate from an apparent contradiction between photoresist removability ("developability") on the one hand and "durability" on the other: To make a photoresist more durable was to make the photoresist less developable.

The present invention seeks to more closely align the competing goals of "durability" and "developability" by utilizing photoreactive, polymeric binders capable of effectively functioning as both a matrix and as a photoreactive component.

In conventional lithographic printing plates, polymeric binders are incorporated into the photoresist to provide film forming properties during coating and to act as the physical backbone or matrix for the resulting photopolymerized structure resulting from exposure. Since conventional wet development techniques are oftentimes based upon the use of strong solvents, tough and comparatively durable polymeric binders may be utilized. The dictates of more narrowly defined parameters for "on press developability", govern latitude in choice of photoresist components, in general, and effectively preclude the use of tough and durable binders or other components that may not be removable under the conditions of a lithographic printing operation.

By way of illustration, in the U.S. patent application Ser. No. 08/146,710 cross-referenced above and entitled "On-Press Developable Lithographic Printing Plates", on-press development is effectuated by the use of high-boiling point, low-vapor pressure developers. These comparatively weak developers solubilize portions of the photoresist such that they may be easily washed away "on-press" by fountain and ink solutions. In this, and like systems, binders that are less durable but more easily dispersed in fountain and ink solutions are favored. However, with such binders, durability is compromised.

In order to compensate for the losses in durability, a photoresist may be designed thicker and with a larger proportion of binder to prevent tackiness. An increase in binder, however, would normally be balanced by a proportionate decrease in photopolymerizable monomers; a concomitant loss of photosensitivity would be expected. It has been found that a printing plate that can be developed effectively "on-press" and which provides image areas of good durability can be realized by utilizing in a photoresist layer thereof a polymeric binder having both structural and photoreactive capabilities. While developed in the context of "on-press" developable printing plates, several diverse applications of the inventive photoreactive polymeric binder are envisioned and enabled by the present disclosure.

SUMMARY OF THE INVENTION

The present invention provides a photoreactive polymeric binder that may be used to improve durability while maintaining and/or enhancing the photosensitivity of a lithographic printing plate. Briefly, in one embodiment, a photoreactive binder is provided comprising a derivatized copolymer of m-isopropenyl-α,α-dimethylbenzyl isocyanate (m-TMI) and an ethylenically unsaturated comonomer. In a method aspect, m-TMI is copolymerized with an ethylenically unsaturated monomer and subsequently derivatized for vinyl group reactivity by reacting the isocyanate groups thereof with a hydroxyalkyl acrylate. The resulting photopolymeric binder provides significantly higher photospeed than the non-reactive binder currently utilized in the production of conventional printing plates. The resulting lithographic printing plate also shows better durability (as manifested by longer run-length) and is more easily developed by high-boiling point, low-vapor pressure developers. As to the preferred preparation of preferred photoreactive binders, the application describes a method of copolymerizing m-isopropenyl-α,α-dimethylbenzyl isocyanate (m-TMI) through complexation with an electron-deficient monomer such as maleic anhydride to accelerate free-radical copolymerization with other monomers, thus providing greater monomer to polymer conversion, and higher molecular weight particularly for polymers containing a high degree of m-TMI substitution. Use of the resulting product in the photoresist of a lithographic printing plate improves its adhesion to an underlying substrate, and thus enhances durability.

In this light, it is an objective of the present invention to provide a photoreactive polymeric binder which may be incorporated into a photopolymerizable, photocrosslinkable or otherwise photorearrangeable composition to effectuate both higher photosensitivity and greater durability.

It is another object of the present invention to provide a high speed, non-tacky lithographic printing plate that may be utilized effectively with a microencapsulated developer system.

It is another object of the present invention to provide an efficient and effective process for producing durable and photosensitive photoresists.

It is another objective of the present invention to provide a photoreactive polymeric binder comprising a derivatized copolymer of m-isopropenyl-α,α-dimethylbenzyl isocyanate and an ethylenically unsaturated comonomer.

It is another objective of the present invention to provide a method of synthesizing a photoreactive polymeric binder by copolymerizing m-isopropenyl-α,α-dimethylbenzyl isocyanate with an ethylenically unsaturated comonomer, and derivatizing the isocyanate groups thereof with a hydroxyalkyl acrylate or hydroxyalkyl methacrylate.

It is another objective of the present invention to provide a photoreactive polymeric binder comprised of a derivatized copolymer of m-isopropenyl-α,α-dimethylbenzyl isocyanate, ethylenically unsaturated comonomers, and maleic anhydride.

It is another object of the present invention to provide a method of synthesizing a photoreactive polymeric binder by utilizing maleic anhydride as a "matchmaker" to give higher monomer-to-polymer conversion, higher molecular weight binder and potential pendant carboxylic acids for improved adhesion and/or developability.

DETAILED DESCRIPTION OF THE INVENTION

Throughout this disclosure the term "on-press" is used to describe both development and printing plates, (e.g., "on-press development", "developing on-press" and "on-press developable lithographic printing plates"). As used herein, the modifier "on-press" will be defined as indicating an ability to develop a useful imagewise distribution of oleophilic and hydrophobic polymeric areas on a printing press after imagewise exposure, without resort to wet development steps or like intermediary processing. "On-press" techniques should be contrasted with other so-called "dry development" techniques: e.g., dry collotype and laser ablation techniques, wherein oleophilic and hydrophobic image areas are formed at exposure; and peel-apart and thermal transfer techniques, wherein oleophilic and hydrophilic image areas are formed after a laminar separation.

In embodiments most closely related to the field of lithography, the present invention provides a photoresist system which is comprised of at least a photosensitive polymerizable monomer and a photoreactive polymeric binder. As formulated, the photoresist system may be prepared as a coating which may be deposited on a suitable lithographic printing plate substrate. Upon photoexposure, exposed regions of the printing plate's photoresist coating are hardened by the effects of homopolymerization of the polymerizable monomer and by graft polymerization or cross linking involving the photoreactive polymeric binder. The resulting printing plate may be developed through conventional methods or through the innovative processes described briefly below and more fully in the cross-referenced applications.

According to one embodiment of the invention, a photoreactive binder comprises a copolymer of repeating units of a derivatized m-isopropenyl-α,α-dimethyl isocyanate (m-TMI) and repeating units from an ethylenically unsaturated copolymerizable monomer, the polymer having the having the following chemical structure, CS(I):

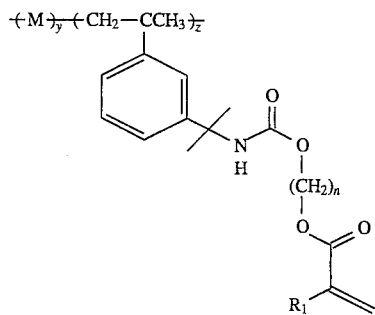

wherein —M— represents polymerized units of ethylenically unsaturated monomers; n is an integer from 1 to 18, preferably from 2 to 6; by weight, y is approximately 70 to 95%, preferably 80 to 90%, and, z is from approximately 5 to 30%, preferably greater than 10%; $R_1$ is H, or an alkyl group, such as a methyl group.

Ethylenically unsaturated monomers that may be used with the present invention may be selected by one skilled in the art in view of the present disclosure. Typically, the ethylenically unsaturated monomers will have the formula $H_2C{=}CR_4R_5$, wherein $R_4$ and $R_5$ are each H, Cl, an alkyl group, such as a methyl group, $-CO_2CH_3$, $-CO_2CH_2CH_3$, $-CO_2Bu$, $-CO_2C_8H_{17}$, $-CO_2C_{12}H_{25}$, $-CO_2Ph$, $-CO_2CH_2CH_2N(CH_3)_2$, $-Ph$, $-CN$, $-C_6H_4CH_2Cl$, $-C_6H_4N$, $-F$, $-COOH$, $-SO_3H$, or their salts. Ethylenically unsaturated monomers substituted for added functionality are also contemplated.

The photoreactive copolymer of chemical structure (I) is obtained by copolymerizing an m-isopropenyl-α,α-dimethyl isocyanate monomer with copolymerizable ethylenically unsaturated monomers (M', below) and derivatizing the pendant isocyanates of the intermediate copolymer with a hydroxyalkyl acrylate or methacrylate, such as 4-hydroxybutyl acrylate. This process is illustrated by the following Synthesis Scheme, SS (I):

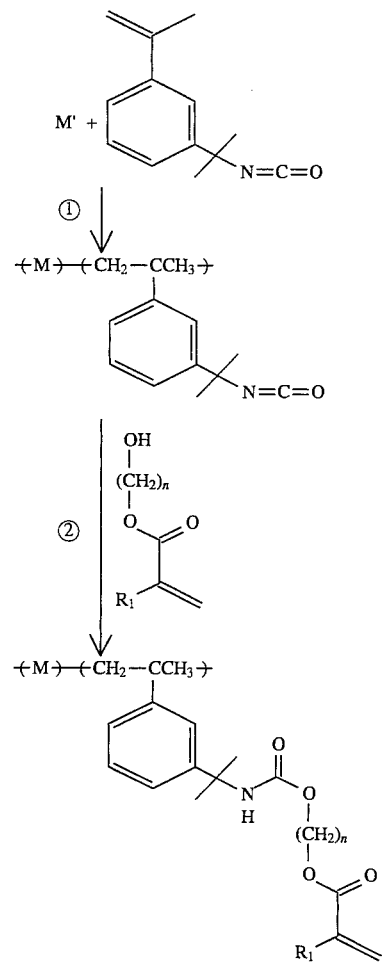

Radical copolymerization, step 1 in Synthesis Scheme (I), is performed, for example, in either the presence of a thermal initiator such as 2,2'-azobis-(2-methylpropionitrile), AIBN, in methyl ethyl ketone, MEK, at 70° C., or t-butyl peroxybenzoate, t-BPB, in refluxing toluene. Reference may be made to the examples, infra, for representative illustration. Other suitable polymerization initiators are known in the art and can be used in the practice of the present invention.

Derivatization, step 2 in Synthesis Scheme (I), is done in the presence initially of radical inhibitors such as 2,6-di-t-butyl-4-methylphenol (BHT) and air, then catalysts for the urethane reaction such as dibutyl tin dilaurate (DBTDL), triethylamine, and esters of p-dimethylaminobenzoic acid.

Reference may be made to the examples, infra, for representative illustration.

It is noted that while 4-hydroxybutyl acrylate (HBA) is the preferred compound for derivatization, other hydroxyalkyl acrylates and methacrylates as well as other vinyl substituted compounds may be used. Examples of such compounds are 2-hydroxyethyl acrylate, 2-hydroxyethyl methacrylate, 2-hydroxpropyl acrylate, 4-hydroxybutyl vinyl ether, allyl alcohol.

The subject of matter represented by Synthesis Scheme (I) and chemical structure (I) are encompassed in U.S. patent application Ser. No. 08/147,045.

According to a second and preferred embodiment of the invention, maleic anhydride is utilized (as a "matchmaker") to increase the "monomer-to-polymer" conversion rate of a radical copolymerization step set forth in, for example, step 1 of Synthesis Scheme (I). In this regard, it will be appreciated that maleic anhydride has an electron poor double bond that may form a charge transfer complex with electron-donor monomers such as styrene, α-methylstyrene, vinyl ethers and vinylcarbazole, forming alternate copolymers. The donor-acceptor monomers can then copolymerize with a third "neutral" monomer such as methyl methacrylate or 2-chloroethyl methacrylate. With regard to its use in accelerating m-TMI copolymerization, maleic anhydride (functioning as an acceptor) may complex with m-TMI (functioning as a donor), and thereby accelerate free-radical copolymerizations with other ethylenically unsaturated comonomers. Maleic anhydride molecules which are not complexed with m-TMI, may still react favorably with m-TMI radicals and result in maleic anhydride radicals which in turn react favorably with acrylate or methacrylate monomers. Electron deficient monomers such as maleic anhydride significantly accelerate the rate and conversion, as well as increase molecular weight as compared to the copolymerization of m-TMI and the ethylenically unsaturated comonomers alone, particularly when the concentration of m-TMI is high in the monomer composition. Aside from maleic anhydride, other useful electron deficient monomers include maleate esters (e.g., diethyl maleate, dibutyl maleate), fumarate esters, and fumaronitrile. In certain equivalent embodiments, maleic anhydride may be replaced (completely or in part) with, for example, n-butyl maleimide. Regardless, maleic anhydride is preferred.

In contrast to the polymeric binders of the first embodiment, i.e. chemical structure (I), the photoreactive polymeric binder synthesized through the maleic anhydride accelerated copolymerization are comprised of polymers having the following generic chemical structure, CS (II):

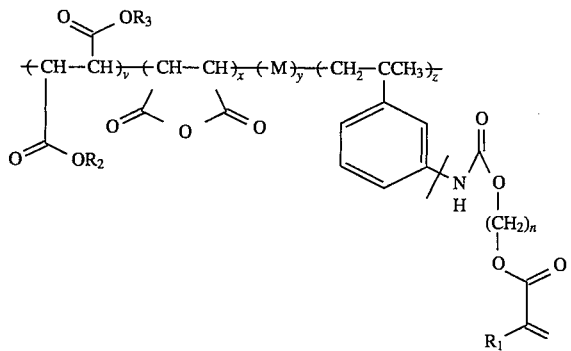

wherein —M—, $R_1$, n, y and z in chemical structure (II) are as described for chemical structure (I); the sum of v and x are from greater than 0 to approximately 10%, and $R_2$ and $R_3$ are H, alkyl or aryl group, and more preferably —$(CH_2)_n O_2 CCH=CH_2$. In a presently preferred embodiment, the sum of v and x is approximately 5% by weight; z is approximately 12% by weight; and y is approximately 86% by weight.

The photoreactive polymeric binders of chemical structure (II) are obtained by initially copolymerizing m-TMI with maleic anhydride and other ethylenically unsaturated monomers, such as methyl methacrylate and butyl methacrylate. The introduction of maleic anhydride results in higher conversion of higher molecular weight compounds. The compounds are then derivatized with a hydroxyalkyl acrylate, such as 4-hydroxybutyl acrylate. The process is illustrated by the synthesis scheme, SS (II):

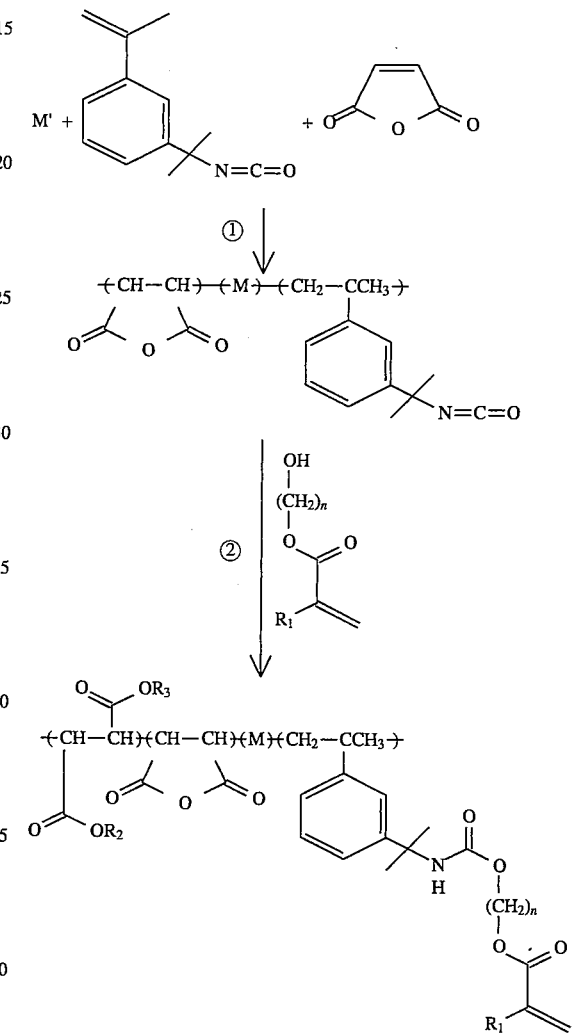

As with Synthesis Scheme (I), the radical copolymerization step, step 1 of Synthesis Scheme (II), can be performed, for example, in the presence of AIBN in either MEK at 70° C. or t-BPB in refluxing toluene. Reference may be made to the examples, infra, for representative illustration. Other suitable polymerization initiators are known in the art and can be used in the practice of the present invention.

The protocol for the derivatization step, step 2 of Synthesis Scheme (II), is the same as the derivatization step for Synthesis Scheme (I). It is noted however that upon derivatization, some of the maleic anhydride units are typically hydrolyzed with provision of carboxylic acid groups pendant from the polymer. These pendant groups promote better adhesion to the printing plate substrate. Such enhanced adhesion helps to prevent the photoresist from being undercut from an underlying substrate by fountain solution and thus contributes to greater durability.

It will be appreciated, that in the photoresist system of the present invention, photohardening of the photoresist layer is effected by reactions involving both the photoreactive binder and the principal photoactive component of the photoresist composition, for example, a photopolymerizable, photocrosslinkable or photorearrangeable compound, typically a photopolymerizable ethylenically unsaturated monomer. The principal photoactive component may include, any variety of compounds, mixtures, or mixtures of reaction compounds or materials capable of being physically altered by photoexposure or of promoting physical alteration (e.g., hardening) of the properties of the layer in areas of photoexposure. Compounds and materials suitable for this purpose include monomeric and oligomeric photopolymerizable compounds which undergo free-radical or cation-initiated addition polymerization. A large number of useful compounds is available, generally characterized by a plurality of terminal ethylenic groups.

Especially preferred for promoting photohardening of polymeric resist layer is a polymerizable monomer which forms a macromolecular or polymeric material upon photoexposure, preferably a photopolymerizable ethylenically unsaturated monomer having at least one terminal ethylenic group capable of forming a high polymer by free-radical initiated or cation-initiated chain-propagated addition polymerization. Examples of such unsaturated compounds include acrylates, acrylamides, methacrylates, methacrylamides, allyl compounds, vinyl ethers, vinyl esters, N-vinyl compounds, styrene, crotonates and the like. Polymerization can be effected by using a photoinitiator, such as a free-radical generating, addition polymerization-initiating system activatable by actinic radiation. Such initiating systems are known and examples thereof are described below.

Preferred polymerizable monomers are the polyfunctional acrylate monomers, such as the acrylate and methacrylate esters of ethylene glycol, trimethylolpropane and pentaerythritol. These can be polymerized in exposed regions of a polymeric photoresist in the presence of a photoinitiator. Suitable photoinitiators include the derivatives of acetophenone (such as 2,2-dimethoxy-2-phenylacetophenone), benzophenone, benzil, ketocoumarin (such as 3-benzoyl-7-methoxy coumarin), xanthone, thioxanthone, benzoin or an alkyl-substituted anthraquinone, diaryl iodonium salt, triaryl sulfonium salts, azobisisobutyronitrile and azo-bis-4-cyano-pentoic acid, although others can be employed.

The practical concentration of the monomer or monomers employed is about 7.5%–70% by weight based on the total solids of the composition, and preferably between 15–40%.

The photoresist systems of the present invention can be suitably coated into a layer which, upon photoexposure, undergoes hardening as the result of polymerization of the polymerizable monomer and grafting of the monomer onto the photoreactive polymeric binder and cross-linking reactions involving the photoreactive polymeric binder. If desired, other crosslinking agents, such as bisazides and polythiols, can be included to promote crosslinking of polymerizable monomer or the binder.

If desired, preformed polymers having pendant pyridium ylide groups, which groups, upon photoexposure, undergo ring expansion (photorearrangement) to a diazepine group with accompanying insolubilization can also be blended with the photoreactive polymer of this invention. Examples of polymers having such pyridium ylide groups are set forth in U.S. Pat. No. 4,670,528, issued to L. D. Taylor and M. K. Haubs on Jun. 2, 1987.

To prepare a lithographic plate according to an embodiment of the present invention, the photoresist system is deposited as layer onto a substrate. Certain factors are considered in determining the appropriate materials for the substrate. Such factors vary with the particular lithographic needs of individual projects and are believed to be within the grasp of one skilled in the pertinent art. Regardless, for most lithographic needs envisioned, suitable substrates will generally include those to which the polymeric resist layer can be adhered adequately, prior to photoexposure, and to which photoexposed printing (image) areas are adhered after photoexposure. Other pertinent considerations may be extrapolated on the basis of the present disclosure.

In practice, substrate materials for use in the manufacture of printing plates will oftentimes be subjected to one or more treatments in order to improve adhesion of the photoresist, or to increase the hydrophilic properties of the substrate material, and/or to improve the developability of the photoresist, as is described in U.S. Pat. No. 4,492,616 (issued Jan. 8, 1985 to E. Pliefke, et al.). Thus, the substrates will typically be treated (for example, with polyvinylphosphonic acid or silicate or by anodization, or by corona discharge or plasma treatment, or by roughening or graining treatment) to promote desired adhesion of the polymeric photoresist.

Especially preferred substrates are the metallic substrates of aluminum, zinc, steel or copper. These include the known bi-metal and tri-metal plates such as aluminum plates having a copper or chromium layer; copper plates having a chromium layer; steel plates having copper or chromium layers; and aluminum alloy plates having a cladding of pure aluminum. Other preferred substrates are silicone rubbers and metallized plastic sheets such as poly(ethylene terephthalate).

Preferred plates are the grained, anodized aluminum plates, where the surface of the plate is roughened mechanically or chemically (e.g., electrochemically) or by a combination of roughening treatments. Anodized plates can be used to provide an oxide surface. Still more preferred plates are anodized aluminum plates which, for example, have been treated with polyvinylphosphonic acid or otherwise provided with a resinous or polymeric hydrophilic layer.

Examples of printing plate substrate materials which can be used in the production of printing plates of the invention, and methods of graining and hydrophilizing such substrates are described, for example, in U.S. Pat. No. 4,153,461 (issued May 8, 1979 to G. Berghäuser, et al.); the aforementioned U.S. Pat. No. 4,492,616 issued to E. Pliefke, et al.; U.S. Pat. No. 4,618,405 (issued Oct. 21, 1986 to D. Mohr, et al.); U.S. Pat. No. 4,619,742 (issued Oct. 28, 1986 to E. Pliefke); and U.S. Pat. No. 4,661,219 (issued Apr. 28, 1987 to E. Pliefke).

It is common practice in preparing photoresist compositions to employ photosensitizers, coinitiators, and activators. Photosensitizers and coinitiators are relied upon to capture photons of exposing radiation. They may absorb light of different wavelengths from the principal photoinitiator. The activator in contrast is not relied upon to respond directly to exposing radiation, but rather adjacent activator and photosensitizer molecules react, following excitation of the latter by photon capture, causing release of a free radical which in turn induces immobilization addition reactions at sites of ethylenic unsaturation.

Photoexposure of the printing plates can be accomplished according to the requirements dictated by the particular composition of the polymeric photoresist and the thickness thereof. In general, actinic irradiation from conventional sources can be used for photoexposure, for example, relatively long wavelength ultraviolet irradiation or visible irradiation. UV sources will be especially preferred and include carbon arc lamps, "D" bulbs, Xenon lamps and high pressure mercury lamps.

The thickness of the photoresist can vary with the particular requirements. In general, it should be of sufficient thickness to provide a durable photohardened printing surface. Thickness should be controlled, however, such that it can be exposed within exposure-time requirements and should not be applied at a thickness that hampers ready removal of the layer in non-exposed areas by developers. When utilizing an anodized, grained aluminum substrate, good results are obtained by using a polymeric photoresist having a thickness in the range of from about 0.2 microns to about 3 microns above the microstructure of the grains, preferably about 0.2 to 0.6 microns "above the grain".

A polymeric photoresist can be provided with colorants, e.g., tint dyes, to provide a desired and predetermined visual appearance. Especially preferred will be a colorant, or a precursor of a species, respectively, capable either of being rendered colorless, or being provided with coloration by the irradiation of the plate-making photoexposure step. Such dye or dye-precursor compounds and the light absorption differences promoted by the photoexposure allow the platemaker to distinguish readily the exposed from the non-exposed regions of the plate in advance of mounting and running the photoexposed plate on a printing press.

In addition, the operability of the polymeric photoresist may be improved by the addition of other components or additives. For example, the polymeric photoresist can contain plasticizers, hardeners, or other agents to improve coatability. If desired, macromolecular organic binders which are non-photoreactive and typically employed in the production of photoresist compositions can be employed to advantage. The polymeric photoresist may also contain antioxidant materials to prevent undesired (premature) polymerization and examples include derivatives of hydroquinone; methoxy hydroquinone; 2,6-di-(t-butyl)-4-methylphenol; 2,2'-methylene-bis-(4-methyl-6-t-butylphenol); tetrakis {methylene-3-(3',5'-di-t-butyl-4'-hydroxyphenyl-)propionate} methane; diesters of thiodipropionic acid, triarylphosphite. While the use of such additives is unnecessary for the operability of the present invention, incorporation of such additives may dramatically enhance performance.

The plasticizers, contrast dyes, imaging dyes and other additives may be microencapsulated and incorporated into the photoresist itself or a separate layer facially positioned or positionable atop the photoresist. Inclusion in the microcapsules would provides a wider latitude in the selection of such additives, since neither the solubility of the additives in the photopolymerizable compositions nor the inhibition or retardation effect of some additives on polymerization would be an issue in such a system.

For wet development, a diluted alkaline solution optionally containing up to 10% by volume of organic solvents may be used. Examples of useful alkaline compounds include inorganic compounds such as sodium hydroxide, potassium hydroxide, lithium hydroxide, sodium benzoate, sodium silicate and sodium bicarbonate; and organic compounds such as ammonia, monoethanolamine, diethanolamine and triethanoloamine. Water-soluble organic solvents useful as developers include isopropyl alcohol, benzyl alcohol, ethyl cellosolve, butyl cellosolve, diacetone alcohol and the like. Depending on particular needs, the developing solution may contain surfactants, dyes, salts for inhibiting the swelling of the photoresist, or salts for corroding the metal substrate.

As another means of development, it is noted that the present invention is especially well suited for several on-press development systems. For example, good results have been accomplished using the photoreactive polymeric binders of the present invention in a photoresist that is in contact or brought into contact with the microencapsulated developer systems described in U.S. patent application Ser. No. 08/146,710, cross-referenced above. The photoresist also incorporated a plasticizing system and a dispersed, particulate rubber system, as described in the above cross-referenced U.S. patent applications Ser. Nos. 08/147,044 and 08/146,479, respectively. See, Example 6, infra, for a representative example.

The present invention will now be described in further detail by the following non-limiting examples of several of its embodiments. Unless otherwise indicated, all parts, percents, ratios and the like are by weight.

EXAMPLES

Preparation of Photopolymer 1

In a 500 ml, three-necked, round bottom flask fitted with a 250 ml addition funnel with a dry $N_2$ inlet, a Claisen adapter bearing a septum, and a condenser with an exit to a gas bubbler, toluene (30 g) was sparged for 5 minutes with $N_2$. In the addition funnel, a solution of m-isopropenyl-α,α-dimethyl isocyanate (13.5 g), methyl methacrylate (41.0 g), butyl methacrylate (45.5 g), toluene (50 g), and t-butyl peroxybenzoate (0.2 g) was sparged for 15 minutes with $N_2$.

The stirred toluene was brought to reflux in a 120° C. bath and the contents of the addition funnel were added over 2 hours. After refluxing an additional 6 hours, a 5% solution of BHT in toluene (10 g) was added. Dry air was then introduced and heating discontinued. After 15 minutes, 4-hydroxybutyl acrylate (11.62 g), triethylamine (2 g of a 10% solution) and dibutyl tin dilaurate (2 g of a 10% solution) were added and the solution was heated at 80° C. for 21 hours. Methanol (10 g) was subsequently added and after heating for 0.5 hrs, 187.4 g of reaction solution was poured into a brown polyethylene bottle.

A 100 g portion of the reaction solution, diluted with methyl ethyl ketone (50 g) was mixed into stirred hexanes (3 L) giving a soft amber precipitate (~75 g). The amber precipitate was dissolved in acetone (150 g) and reprecipitated over 2 hours in stirred methanol (3 L). A stringy, white precipitant was collected by vacuum filtration, rinsed with methanol (2×100 ml), broken into small pieces and air dried overnight. 31.1 g of white precipitant was retrieved (31.1 g, 53% yield). GPC: Mw 116,221: Mn 58,875; DSC: Tg 72° C.

Preparation of Photopolymer 2

By the procedure described for the preparation of Photopolymer 1, m-isopropenyl-α,α-dimethyl isocyanate (13.5 g), methyl methacrylate (63 g), butyl methacrylate (23.5 g), toluene (50 g) and t-butyl peroxybenzoate (0.2 g) were used in polymerization, followed by the derivatization with 4-hydroxybutyl acrylate (11.6 g) to give 27.4 g of solid (47.0%). GPC: Mw 113,099; Mn 55,775; DSC: Tg 90° C.

Preparation of Photopolymer 3

Photopolymer 3 was prepared in the same manner as Photopolymer 2, except 1 g of maleic anhydride was used to replace 1 g of the methyl methacrylate in the monomer feed, giving 36.55 g of solid (74.4%). GPC: Mw 140,765; Mn 52,768; DSC: Tg 87° C.

Preparation of Photopolymer 4

Photopolymer 4 was prepared in the same manner as Photopolymer 2, except 15 g of m-isopropenyl-α,α-dimethyl isocyanate, 61.5 g of methyl methacrylate, 23.5 g of butyl methacrylate and 1.25 g of t-butyl peroxybenzoate were used in the monomer feed, giving a 65.5% yield. GPC: Mw 33750; Mn 11400; DSC: Tg 72° C.

Preparation of Photopolymer 5

Photopolymer 5 was prepared in the same manner as Photopolymer 4, except 1.25 g of methyl methacrylate were substituted with 1.25 g of maleic anhydride, giving a 77% yield. GPC: Mw 54625, Mn 15636; DSC: Tg 82° C.

Preparation of Photopolymer 6

By the procedure described for Photopolymer 1, m-isopropenyl-α,α-dimethyl isocyanate (13.5 g), methyl methacrylate (62 g), butyl methacrylate (23.5 g), toluene (50 g) and t-butyl peroxybenzoate (0.5 g) were used in the polymerization. In the subsequent derivatization, 4-hydroxybutyl acrylate (8.7 g), triethylamine (2 g of a 10% soln.) and dibutyl tin dilaurate (10 g of a 10% soln.) were utilized and the solution heated at 80° C. for 21 hours. Methanol (20 g) was added. After heating 0.5 hours, an amber solution was obtained (198.73 g, 43.4% solids, 78% yield). GPC: Mw 86,000; Mn 37,000; DSC: Tg 76.7° C. This solution was used directly in formulating a photoresist layer.

Preparation of Photopolymer 7

Preparation of Photopolymer 7 was the same as Photopolymer 6, except 1 g of maleic anhydride replaced 1 g of the methyl methacrylate in the monomer feed, giving an amber solution (191.73 g, 49.93% solids, 87% yield). GPC: Mw 145,000; Mn 36,000; DSC: Tg 88.4° C. This solution was used directly in formulating a photoresist layer.

The efficacy of the maleic anhydride acceleration mechanism used in the preparation of Photopolymers 3, 5, and 7 will be evident from the results summarized in Table 1, below.

5 shows a higher conversion and molecular weight than the corresponding Photopolymer 4 synthesized without maleic anhydride.

Preparation of Photopolymer 8

In a 2 L, three-necked, round bottom flask fitted with a mechanical stirrer; dry $N_2$ inlet; fluid metering pump delivery tube; and Claisen adapter bearing a thermometer and a condenser with an exit to a gas bubbler, toluene (140 g) was sparged for 5 minutes with $N_2$. In an addition pump reservoir, a solution of m-isopropenyl-α,α-dimethyl isocyanate (44.3 g), maleic anhydride (8.87 g), methyl methacrylate (285.9 g), butyl methacrylate (104.16 g), toluene (191.69 g) and t-butyl peroxybenzoate (1.55 g) was sparged for 15 minutes with $N_2$.

The initial charge was stirred (150 rpm) and brought to reflux in a 120° C. bath, whereupon a solution of t-butyl peroxybenzoate (0.66 g) in toluene (10 g) was injected, and the contents of the feed reservoir were metered out for a period of 6 hours. After heating an additional 2 hours, a 10% solution of ethyl 4 -N,N-dimethylaminobenzoate (EPD) in toluene (23.05 g) was added under dry $N_2$ and heating discontinued. After 30 minutes, 4-hydroxybutyl acrylate (40.01 g), BHT (44.33 g of a 5% solution), DBTDL (44.33 g of a 10% solution) and dry air were introduced, and the solution heated at 80° C. for 16 hours. Methanol (50 g) was added, and after heating for 0.5 hours, 957.3 g of a reaction solution was obtained (40.2% solids, theory: 50%), giving a 78% yield. GPC: Mw 107,000; Mn 35,000; DSC: Tg 90.4° C. This solution was used directly in formulating a photoresist layer.

Preparation of Photopolymer 9

By the procedure described for the preparation of Photopolymer 8, m-isopropenyl-α,α-dimethylbenzyl isocyanate (44.3 g), maleic anhydride (11.08 g), methyl methacrylate (283.68 g), butyl methacrylate (104.16 g), toluene (346.72 g) and t-butyl peroxybenzoate (4.42 g) were used in the polymerization, followed by derivatization with 4-hydroxy-

TABLE 1

Maleic Anhydride as the "Match Maker" For TMI/Acrylate Copolymerization

|  | Photopolymer 2 | Photopolymer 3 w/MA | Photopolymer 4 | Photopolymer 5 w/MA | Photopolymer 6 | Photopolymer 7 w/MA |
|---|---|---|---|---|---|---|
| Wt % m-TMI | 13.5 | 13.5 | 15 | 15 | 13.5 | 13.5 |
| Wt % MMA | 63 | 62 | 61.5 | 60.25 | 63.0 | 62 |
| Wt % BMA | 23.5 | 23.5 | 23.5 | 23.5 | 23.5 | 23.5 |
| Wt % MA | 0 | 1 | 0 | 1.25 | 0.0 | 1.0 |
| % Initiator | 0.2 | 0.2 | 1.25 | 1.25 | 0.5 | 0.5 |
| Mw | 113099 | 140765 | 33750 | 54625 | 86000 | 145000 |
| Mn | 55775 | 52768 | 11400 | 15636 | 37000 | 36000 |
| % Yield | 47 | 74 | 65.5 | 77 | 78 | 87 |

As shown in Table 1, the use of 1% maleic anhydride in the synthesis of Photopolymers 3 and 7 gave lower residual monomer and higher weight average molecular weight than the corresponding Photopolymers 2 and 6. Likewise the use of 1.25% maleic anhydride in the synthesis of Photopolymer butyl acrylate (30.16 g). 935.8 g of solution was obtained (51.82% solids; theory 986.03 g, 49.4%), constituting a 99.6% yield. GPC: Mw 127,029; Mn 22,500; DSC: Tg 75° C.

Preparation of Photopolymer Rx-2

In the manner of the procedures described for the preparation of Photopolymers 1 to 9, Photopolymer Rx-2 is prepared in accordance with the following tabulated protocol.

| STEPS: Components | % wt | wt (g) | mole % |
|---|---|---|---|
| INITIAL CHARGE: | | | |
| Maleic Anhydride | 8.5 | 0.75 | 0.11 |
| m-TMI | 17.5 | 1.552 | 0.10 |
| Methyl Methacrylate | 56 | 4.96 | 0.65 |
| Butyl Methacrylate | 18 | 1.596 | 0.15 |
| Toluene | — | 32 | — |
| ADDITION I (Under Dry Nitrogen): | | | |
| t-Butyl Peroxybenzoate | — | 0.396 | — |
| Toluene | — | 2 | — |
| ADDITION II (Under Dry Nitrogen): | | | |
| Maleic Anhydride | 8.5 | 6.78 | 0.10 |
| m-TMI | 17.5 | 13.962 | 0.10 |
| Methyl Methacrylate | 56 | 44.67 | 0.65 |
| Butyl Methacrylate | 18 | 14.361 | 0.15 |
| Toluene | — | 35.344 | — |
| t-butyl Peroxybenzoate | — | 0.93 | — |
| QUENCH I (Under Dry Nitrogen): | | | |
| Ethyl 4-N,N-Dimethylaminobenzoate, 10% | — | 4.61 | — |
| DERIVATIZATION (Under Dry Air): | | | |
| 4-Hydroxybutyl Acrylate | — | 10.56 | 0.10 |
| Dibutyl Tin Dilaurate, 10% | — | 8.866 | — |
| 2,6-Di-t-Butyl-4-methylphenol, 5% | — | 8.866 | — |
| QUENCH II: | | | |
| Methanol | — | 10 | — |

202.203 g of solution was obtained (50.60% solids). GPC: Mw 100,300; Mn 17,959; DSC: Tg 88.7° C. (onset), 96.6° C. (midpoint); m-TMI-HBA Pendant Vinyl: 9.5 mole %.

EXAMPLE 1

An aluminum substrate was electrochemically grained and anodized to give a porous aluminum oxide surface. This surface was then treated with a polymeric acid to produce an aluminum plate which was suitable for lithographic printing. A solution was then prepared based on the formulation in Table 2.

TABLE 2

| Component | % Solids |
|---|---|
| Photopolymer 1 | 56.35 |
| Hexafunctional Urethane Acrylate (Ebecryl 8301 from Radcure) | 10.70 |
| Difunctional Urethane Acrylate (PU788 from Morton) | 2.88 |
| Trimethylolpropane triacrylate | 4.76 |
| Cab-o-Sil M5 Silica | 1.00 |
| Hycar Rubber (1300 × 33 from B.F. Goodrich) | 4.00 |
| 3-benzoyl-7-methoxycoumarin | 1.40 |
| [4-(4-methylphenylthio)phenyl]-phenylmethanone | 1.80 |
| 2,2'-bis(o-chlorophenyl)-4,4',5,5'-tetraphenyl-1,2-biimidazole | 3.50 |
| Diphenyl Phosphate | 2.25 |
| 4,4'-methylenebis-(2,6-diisopropyl-N,N-dimethylaniline) | 2.25 |
| Pluronic L43 (from BASF) | 2.50 |
| Triethylene Glycol Diacetate | 3.00 |
| Lithium Chloride | 0.62 |
| Leuco Crystal Violet | 3.00 |
| 2,6-di-(t-butyl)-4-methylphenol | 0.14 |
| Ciba-Geigy Irganox 1035 | 0.10 |

A 7% solution of the formulation in MEK/Toluene was spin coated onto a plate at a spin rate of 200 rpm.

The coated plate was then exposed to actinic radiation from a standard mercury halide lamp, which had an emission peak in the ultraviolet range at 364 nm. The plate was then exposed through an UGRA target mask to produce a test image. The plate was then developed with a mixture of 55% ethyl acetate and 45% isopropanol, washed with 60% ethyl acetate and 40% isopropanol, and dried in a 70° C. oven for 10 minutes. The developed plate was subsequently gummed with a protective finisher, and stored under ambient conditions.

The plate was then placed on a Komori printing press and run in standard operation. The plate was run continuously for more than 50,000 good impressions.

EXAMPLE 2 (COMPARATIVE)

A formulation identical to that in table 2 was coated on an aluminum substrate in the same manner as in Example 1, except that 19.6% poly(methyl methacrylate), i.e. Acryloid Resin A-11 from Rohm & Haas, and 36.75% of a 50/50 copolymer of ethyl methacrylate and methyl acrylate, i.e. Acryloid Resin B-72 from Rohm & Haas, were substituted for Photopolymer 1. When this plate was exposed and developed under conditions identical to those of the previous example, the photoresist degraded to a state of practical uselessness before the completion of 1000 impressions.

EXAMPLE 3

Photopolymer 2 (0% maleic anhydride) and Photopolymer 3 (1% maleic anhydride) were tested using the same aluminum substrate and formulation set forth in Example 1, except for a lower binder to monomer ratio. Their compositions are shown in Table 3.

TABLE 3

| Component | Plate 3A | Plate 3B |
|---|---|---|
| Photopolymer 2 (0% maleic anhydride) | 40.25 | — |
| Photopolymer 3 (1% maleic anhydride) | — | 40.25 |
| Hexafunctional Urethane Acrylate (Ebecryl 8301 from Radcure) | 18.1 | 18.1 |
| Difunctional Urethane Acrylate (PU788 from Morton) | 5.40 | 5.40 |
| Trimethylolpropane triacrylate | 8.93 | 8.93 |
| Cab-o-Sil M5 Silica | 1.00 | 1.00 |
| Hycar Rubber (1300 × 33 from B.F. Goodrich) | 4.00 | 4.00 |
| 3-benzoyl-7-methoxycoumarin | 1.40 | 1.40 |
| [4-(4-methylphenylthio)phenyl]-phenylmethanone | 1.80 | 1.80 |
| 2,2'-bis(o-chlorophenyl)-4,4',5,5'-tetraphenyl-1,2-biimidazole | 3.50 | 3.50 |
| Diphenyl Phosphate | 2.25 | 2.25 |
| 4,4'-methylenebis-(2,6-diisopropyl-N,N-dimethylaniline) | 2.25 | 2.25 |
| Pluronic LA3 (from BASF) | 2.50 | 2.50 |
| Triethylene Glycol Diacetate | 3.00 | 3.00 |
| Lithium Chloride | 0.62 | 0.62 |
| Leuco Crystal Violet | 3.00 | 3.00 |
| 2,6-di-(t-butyl)-4-methylphenol | 0.14 | 0.14 |
| Irganox 1035 (from Ciba-Geigy) | 0.10 | 0.10 |

Both plates were exposed through an UGRA target mask and a step wedge (3 step/stop), developed by solvents and gummed as described in Example 1. Both plates could be run for more than 50,000 good impressions. However, Photopolymer 3 (1% maleic anhydride) showed roughly a 25% faster photospeed than Photopolymer 2 (0% maleic anhydride).

EXAMPLE 4

Photopolymers 6 (0% maleic anhydride) and Photopolymer 7 (1% maleic anhydride) were tested using the same aluminum substrate and formulation set forth in Example 1, except for a lower binder to monomer ratio. Their compositions are shown in Table 4:

TABLE 4

| Component | Plate 4A | Plate 4B |
|---|---|---|
| Photopolymer 6 (0% maleic anhydride) | 49.00 | — |
| Photopolymer 7 (1% maleic anhydride) | — | 49.00 |
| Hexafunctional Urethane Acrylate (Ebecryl 8301 from Radcure) | 15.57 | 15.57 |
| Difunctional Urethane Acrylate (PU788 from Morton) | 4.19 | 4.19 |
| Trimethylolpropane triacrylate | 6.92 | 6.92 |
| Cab-o-Sil M5 Silica | 1.00 | 1.00 |
| Hycar Rubber (1300 × 33 from B.F. Goodrich) | 4.00 | 4.00 |
| 3-benzoyl-7-methoxycoumarin | 1.40 | 1.40 |
| [4-(4-methylphenylthio)phenyl]-phenylmethanone | 1.80 | 1.80 |
| 2,2'-bis(o-chlorophenyl)-4,4',5,5'-tetraphenyl-1,2-biimidazole | 3.50 | 3.50 |
| Diphenyl Phosphate | 2.25 | 2.25 |
| 4,4'-methylenebis-(2,6-diisopropyl-N,N-dimethylaniline) | 2.25 | 2.25 |
| Pluronic L43 (from BASF) | 2.50 | 2.50 |
| Triethylene Glycol Diacetate | 3.00 | 3.00 |
| Lithium Chloride | 0.62 | 0.62 |
| Leuco Crystal Violet | 3.00 | 3.00 |
| 2,6-di-(t-butyl)-4-methylphenol | 0.14 | 0.14 |
| Ciba-Geigy Irganox 1035 | 0.10 | 0.10 |

After exposure at 2.5, 5, 7.5, 10 and 40 LU, solvent development, and gumming as in Example 1, the plates were run on a Multigraphics Form Press for 50,000 impressions. Plate 4B (Photopolymer 7) showed an initial maximum step Dmax of 3 (7.5 LU), dropping back to 2 and remaining steady for the run. At 5 LU, 2% highlight dot decreased to 3% by 15,000 impressions, where it remained through the run. In contrast, Plate 4A (Photopolymer 6) required 10 LU for an initial step Dmax of 3 which dropped to 1 by 25,000 impressions. At 7.5 LU, the step Dmax was 2 and dropped to 1 and highlight dot was 3% dropped to 5% by 50,000 impressions. Again, the performance of the photopolymer containing 1% maleic anhydride was superior to the photopolymer containing no maleic anhydride.

EXAMPLE 5

Photopolymer 8 (2% maleic anhydride) was tested using the same aluminum substrate and formulation set forth in Example 1, except for a lower binder to monomer ratio. The composition is shown in Table 5:

TABLE 5

| Component | % Solids |
|---|---|
| Photopolymer 8 (2% maleic anhydride) | 49.00 |
| Hexafunctional Urethane Acrylate (Ebecryl 8301 from Radcure) | 15.57 |
| Difunctional Urethane Acrylate (PU788 from Morton) | 4.19 |
| Trimethylolpropane triacrylate | 6.92 |

TABLE 5-continued

| Component | % Solids |
| --- | --- |
| Cab-o-Sil M5 Silica | 1.00 |
| Hycar Rubber (1300 × 33 from B.F. Goodrich) | 4.00 |
| 3-benzoyl-7-methoxycoumarin | 1.40 |
| [4-(4-methylphenylthio)phenyl]-phenylmethanone | 1.80 |
| 2,2'-bis(o-chlorophenyl)-4,4',5,5'-tetraphenyl-1,2-biimidazole | 3.50 |
| Diphenyl Phosphate | 2.25 |
| 4,4'-methylenebis-(2,6-diisopropyl-N,N-dimethylaniline) | 2.25 |
| Pluronic L43 (from BASF) | 2.50 |
| Triethylene Glycol Diacetate | 3.00 |
| Lithium Chloride | 0.62 |
| Leuco Crystal Violet | 3.00 |
| 2,6-di-(t-butyl)-4-methylphenol | 0.14 |
| Irganox 1035 (from Ciba-Geigy) | 0.10 |

After exposure at 2.5, 5, 7.5, 10 and 20 LU, solvent development and gumming as in Example 1, the plate was run on a Komori printing press for 100,000 impressions. At 10 LU, initial 2% highlight dot coverage on paper remained above 100,000 impressions. At 7.5 LU, 2% highlight dot dropped to 3% by 60,000 impressions, where it remained through the run.

EXAMPLE 6

A photoresist solution with 7% of solid was made according to the formulation set forth below. The photoresist solution contained a photoreactive polymeric binder prepared in accordance with the present invention:

| Component | % (w/w) |
| --- | --- |
| Photoreactive Acrylic Binder* | 51.75 |
| Ebecryl 8301 oligomer (from Radcure) | 17.42 |
| Trimethylolpropane triacrylate | 4.68 |
| Polyurethane PU788 (from Morton) | 7.74 |
| Acrylated Nitrile Butadiene (Hycar 1300 × 33, Goodrich) | 4.00 |
| 3-benzoyl-7-methoxy coumarin** | 1.40 |
| 4-benzoyl-4-methyl diphenyl sulfide** | 1.80 |
| 2-phenyl-4,6-bis-(trichloromethyl-5-triazine)** | 2.21 |
| Triethylene glycol diacetate | 3.50 |
| Leuco Crystal Violet Dye | 2.77 |
| 2,6-di-tert-butyl-4-methyl phenol (BHT)*** | 0.13 |
| Irganox 1035 (from Ciba-Geigy) | 0.10 |
| Pluronic L43 Surfactant (from BASF) | 2.50 |

Notes:
*The photoreactive binder contained methyl methacrylate, butyl methacrylate, maleic anhydride, and an m-TMI adduct with hydroxybutyl acrylate;
**Radical initiator;
***Antioxidant.

The photoresist composition was coated onto an anodized aluminum plate by continuous roll coating, exposed to actinic radiation, then on-press developed. On-press development of the photoresist was effectuated by the agency of high-boiling, low-vapor pressure developers liberated from ruptured microcapsules coated atop the photoresist.

The microcapsules were prepared by first dissolving 8.0 g HEC 330 PA (from Hercules), 3.9 g Versa TL 502 (from National Starch), 0.06 g Aerosol OT (from Fisher) in 425 g $H_2O$. A mixture of 21.5 g gamma nonalactone, 89.5 g dibutyl phthalate, and 11.1 g Desmodur N-100 (from Miles) was then dispersed into the aqueous phase at 1500 rpm for 10 minutes. To encourage the formation of prewall, a small amount of dibutyl tin dilaurate (0.12 g) was added into the oleophilic phase. 1.4 g of triethylene tetramine was added and allowed to react for 2 hours at room temperature. 41.1 g of a melamine-formaldehyde prepolymer (CYMEL 385, from American Cyanamid) was added and the pH adjusted to between 5 and 5.5 with 1N sulfuric acid. The reaction was continued at 65° C. for one hour. 10.0 gs of urea were added to react for one hour to quench all residual formaldehyde and/or melamine-formaldehyde condensate in the mixture. Sodium Chloride (18.3 g) was added and the pH was brought to 9 and the reaction allowed to continue for 30 minutes, then slowly cooled to 25° C. The microcapsules were washed extensively with deionized water in a centrifuge.

A microcapsule-containing coating solution was subsequently prepared utilizing 9.45 g microcapsules (at 39.7% w/v), 0.47 g Silica 2040 (at 40% w/v), 1.13 g PVA 205 (at 10% w/v), 2.24 g Pluronic L43 surfactant (at 5% w/v); Tx100 surfactant (at 10% w/v), 0.06 g LiCl (at 2% w/v) and 11.47 g $H_2O$.

The microcapsule-containing coating solution was coated atop the photoresist. After exposing the plate to 40 UV light units, the plate was run through a pressure roller then mounted and ran on a Multigraphics 1250 lithographic printing press. The plate on-press developed within 20 impressions.

We claim:

1. A photoreactive polymeric binder of the formula:

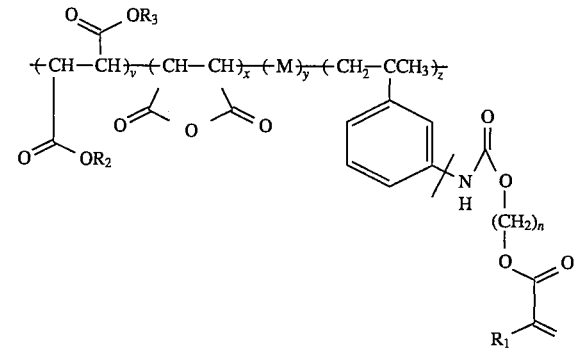

wherein n is an integer from 1 to 18;

—M— is one or more polymerized units of ethylenically unsaturated monomers;

y is approximately 70% to approximately 95% by weight, z is from approximately 5% to approximately 30% by weight, and the sum of v and x are from greater than 0% to approximately 10% by weight;

$R_1$ is H, or alkyl; and $R_2$ and $R_3$ are each H, alkyl, aryl, or —$(CH_2)_nO_2CCH=CH_2$.

2. The photoreactive polymeric binder of claim 1, wherein n is an integer from 2 to 6.

3. The photoreactive polymeric binder of claim 1 wherein either $R_2$ or $R_3$ is —$(CH_2)_nO_2CCH=CH_2$.

4. A method for synthesizing photoreactive polymeric binders comprising the steps of copolymerizing an m-isopropenyl-α,α-dimethylbenzyl isocyanate monomer with an electron deficient comonomer and a substituted comonomer of the formula $CH_2=CR_1R_2$, wherein $R_1$ and $R_2$ are each H, Cl, alkyl, —$CO_2CH_3$, —$CO_2CH_2CH_3$, —$CO_2Bu$, —$CO_2C_8H_{17}$, —$CO_2C_{12}H_{25}$, —$CO_2Ph$, —$CO_2CH_2CH_2N(CH_3)_2$, —Ph, —CN, —$C_6H_4CH_2Cl$, —$C_6H_4N$, —F, —COOH, —$SO_3H$, or their salts; and derivatizing the copolymer with a hydroxyalkyl acrylate of the formula $HO(CH_2)_nO_2CCH=CH_2$, wherein n is an integer from 1 to 18.

5. The method of claim 4, wherein the concentration of the m-isopropenyl-α,α-dimethylbenzyl isocyanate monomer is from approximately 5% to approximately 30% by weight, the concentration of the electron deficient monomer is from greater than 0% to approximately 10% by weight, and the total concentration of the substituted comonomers is from approximately 70% to approximately 95% by weight.

6. The method of claim 4, wherein the electron deficient comonomer is a maleic anhydride comonomer.

* * * * *